United States Patent [19]

Milgram

[11] 4,440,804
[45] Apr. 3, 1984

[54] LIFT-OFF PROCESS FOR FABRICATING SELF-ALIGNED CONTACTS

[75] Inventor: Alvin Milgram, Sunnyvale, Calif.

[73] Assignee: Fairchild Camera & Instrument Corporation, Mountain View, Calif.

[21] Appl. No.: 404,109

[22] Filed: Aug. 2, 1982

[51] Int. Cl.³ .............................................. B05D 5/12
[52] U.S. Cl. ...................................... 427/91; 427/38; 427/99
[58] Field of Search .................... 427/43.1, 91, 99, 88, 427/38

[56] References Cited

U.S. PATENT DOCUMENTS

| | | | |
|---|---|---|---|
| 3,985,597 | 10/1976 | Zielinski | 427/91 |
| 4,070,501 | 1/1978 | Corbin et al. | 427/88 |
| 4,218,283 | 8/1980 | Saiki et al. | 427/96 |
| 4,323,638 | 4/1982 | Adams et al. | 427/43.1 |
| 4,378,383 | 3/1983 | Moritz | 427/91 |

Primary Examiner—John H. Newsome
Attorney, Agent, or Firm—Kenneth Olsen; Carl L. Silverman; Ronald Craig Fish

[57] ABSTRACT

A process is provided for fabricating self-aligned contacts to the surface of an integrated circuit. The process includes the steps of depositing a layer of silicon dioxide 12 on the surface of a semiconductor structure 10; depositing a layer of polyimide 15 on the surface of the silicon dioxide 12; defining openings 23 in the polyimide material 15 and the silicon dioxide 12 to thereby expose regions of the semiconductor structure 10; and depositing metal 22 across the underlying surface and in the openings 23. In the preferred embodiment metal 22 is substantially the same thickness as silicon dioxide 12, and polyimide material 15 is masked using sequentially deposited layers of silicon dioxide 18 and photoresist 21.

8 Claims, 7 Drawing Figures

LIFT-OFF PROCESS FOR FABRICATING SELF-ALIGNED CONTACTS

BACKGROUND OF THE INVENTION

1. Field of the Invention

This invention relates to the fabrication of integrated circuits, and in particular, to the use of lift-off technology for fabricating self-aligned electrical connecting regions to integrated circuit structures.

2. Description of the Prior Art

A technique which is receiving increasing attention for the fabrication of metal connections to integrated circuits is lift-off processing. The name originates from the fact that materials which are deposited over areas of an integrated circuit where they are not needed are subsequently removed by being physically lifted from the surface of the circuit by removal of an underlying masking layer. Lift-off processing offers several advantages over conventional etching techniques commonly employed for such processes. For example, finer tolerances are achievable without radiation damage to active devices which may accompany plasma processing. The lift-off process allows high yields and is compatible with almost any desired material. Lift-off processing permits the fabrication of metal lines with well-defined contours which may be more easily overcoated with passivating material.

Typical prior art techniques for fabricating metal contacts using lift-off processing are described in: "Lift-Off Techniques for Fine Line Metal Patterning," by J. M. Frary and P. Seese, *Semiconductor International*, December 1981, pages 72–89, and "Polyimide Lift-Off Technology for High-Density LSI Metalization," by Y. Homma et al., IEEE *Transactions on Electron Devices*, Vol. ED-28, No. 5, May 1981, pages 552–556.

Conventional lift-off processes, however, suffer from several disadvantages when used to fabricate metal contacts. First, such processes are often not self-aligned, thereby requiring the use of more than one mask to define the contact area. Secondly, such prior art processes result in a non-planar upper surface of the semiconductor structure, which is more difficult to coat with subsequent layers of materials.

SUMMARY OF THE INVENTION

This invention provides a self-aligned contact structure using lift-off processing which overcomes the disadvantages of prior art processes. In particular, this invention provides a self-aligned metal contact which is electrically isolated from surrounding metal contacts by a field of insulating material. As such the invention provides a planar surface more amenable to subsequent process operations.

In one embodiment a lift-off process for fabricating self-aligned regions on the surface of a semiconductor structure includes the steps of: depositing a layer of first material on the surface of the semiconductor structure; depositing a layer of organic masking material on the layer of first material; defining openings in a layer of organic masking material to thereby expose regions of the layer of first material; removing the thereby exposed regions of first material to thereby expose regions of the underlying semiconductor structure; and depositing second material across the surface of the organic masking material and in the openings. Typically the organic masking material and the second material deposited thereon are then removed to create a substantially planar structure in which regions of second material are surrounded by first material.

DETAILED DESCRIPTION OF THE PREFERRED EMBODIMENTS

The preferred embodiments of this invention will be described in conjunction with a process for forming electrical connections to the surface of a semiconductor structure. It should be understood, however, that the process may have other applications. In particular, the process may be applied to any step in the fabrication of integrated circuits in which it is desired to form a first region on the surface of a semiconductor structure which is self-aligned with surrounding materials.

Figure 1:
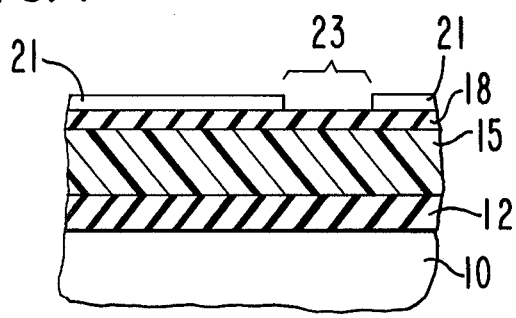
FIG. 1 is a cross-sectional view of a semiconductor structure illustrating a beginning structure for the process of this invention.

FIG. 1 is a cross-sectional view of a semiconductor structure which may be fabricated using known process steps. As shown in FIG. 1 on the upper surface of a silicon substrate 10 a layer of silicon dioxide 12 is formed. Substrate 10 may be a pure silicon wafer, or it may already have formed therein various active and passive electronic components, such as an integrated circuit. In the preferred embodiment substrate 10 will include an integrated circuit and the process of this invention will be used to fabricate self-aligned electrical connections to regions at the surface of the integrated circuit. The silicon dioxide layer 12 formed on the upper surface of wafer 10 will be 0.5 to 1.0 micron thick and may be fabricated using a thermal oxidation process in which wafer 10 is heated to a temperature of approximately 1200° C. for 6 hours.

On the upper surface of silicon dioxide 12 a relatively thick layer of polyimide material, on the order of 1.5 to 4 microns, is deposited. In the preferred embodiment this polyimide material comprises Ciba-Geigy material XU218HP. The polyimide material will typically be deposited in a fluid state and then cured to harden it. In some embodiments of the invention an adhesion promotor, for example, a siloxane material such as DuPont VM 651, will first be applied to the surface of silicon dioxide 12 to improve the adhesion of polyimide material 15 to the surface of silicon dioxide 12. On the upper surface of polyimide material 15 a thinner layer of silicon dioxide 18, typically 0.10 to 0.25 microns thick, is formed. Silicon dioxide 18 may be deposited using chemical vapor deposition, thermal evaporation, or other well-known processes. Finally, on the upper surface of silicon dioxide 18 a layer of photoresist 21 is deposited. Photoresist 21 will typically be positive photoresist, for example, AZ 1450J manufactured by Shipley Company, Inc. Finally, as also shown in FIG. 1, an opening 23 is made in the photoresist 21 to expose the surface of silicon dioxide 18. Opening 23 may be fabricated using known photolithographic techniques, direct exposure by electron beam, or other well-known processes.

Figure 2:
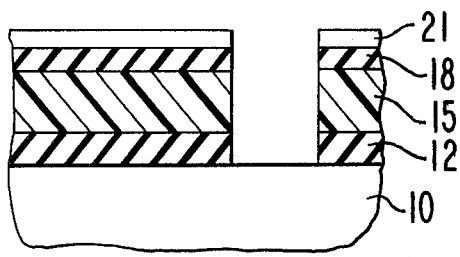
FIG. 2 is a subsequent cross-sectional view after anisotropically etching the structure shown in FIG. 1.

The structure is then processed as depicted in FIG. 2. First, using a carbon tetrachloride and 20% oxygen dry plasma gas etching process, silicon dioxide layer 18 is removed from opening 23. Without removing the wafer from the plasma etching apparatus, the etch gas is switched to pure oxygen, and oxygen plasma is used to etch the polyimide material 15. During this step the photoresist layer 21 will be completely removed. The process is continued until the silicon dioxide layer 12 is exposed. Again, without removing the wafer from the plasma etch apparatus, the gas is switched to carbon tetrafluoride and 35% hydrogen, and silicon dioxide 12 etched until the surface of structure 10 is exposed. The mixture of carbon tetrafluoride and hydrogen is used because it does not attack organic materials such as polyimide 15, and because it has about a ten to one selectivity for silicon dioxide over silicon. The structure is then dipped in hydrochloric acid to remove any residue from the plasma etching process, and its appearance is as depicted in FIG. 2.

In the preferred embodiment the structure is now returned to the plasma reactor and a dry plasma oxygen etch is used to obtain isotropic etching to expand the size of opening 23 and remove additional polyimide 15 as shown. Typically the overall width of window 23 and polyimide 15 will increase by 0.1 to 0.2 microns. In an alternative embodiment a mixture of sulfuric acid and hydrogen peroxide is used to chemically etch back polyimide material 15, creating the same result.

Figure 4:
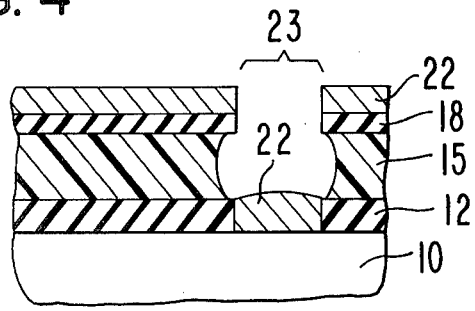
FIG. 4 is a subsequent cross-sectional view illustrating the appearance of the structure after deposition of a layer of metal.

As next shown by FIG. 4, a selected material 22 is deposited across the surface of the structure and into opening 23. In the preferred embodiment, in which metal contacts are being fabricated, material 22 will comprise an aluminum alloy or metal silicide used to form electrical connections to the surface of substrate 10. Also, in the preferred embodiment, material 22 will be deposited to a thickness substantially equal to the thickness of silicon dioxide 12, that is, between 0.5 and 1.0 microns. In this manner, after the lift-off process is complete a substantially planar surface will result.

Figure 3:
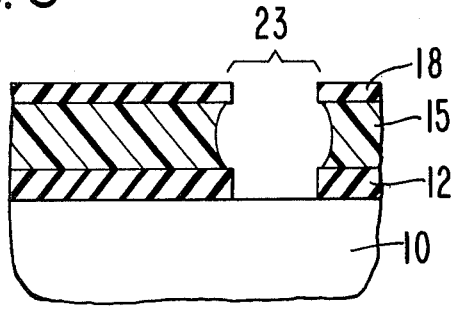
FIG. 3 is a subsequent cross-sectional view in which the structure of FIG. 2 has been further etched using an isotropic process.

In the preferred embodiment metal 22 is deposited after the structure shown in FIG. 3 is raised to a temperature of approximately 325° C. to achieve better metal coverage. To insure that as little metal 22 as possible is deposited upon the exposed edges of polyimide material 15 in opening 23, a normal incidence deposition of the metal is preferred.

Figure 5:
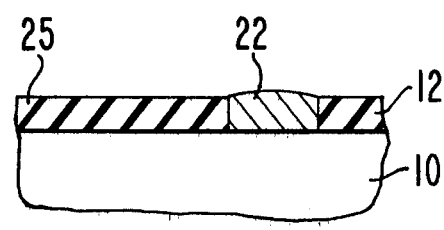
FIG. 5 is a final cross-sectional view illustrating the appearance of the structure after lift-off of the organic masking material.

As next shown by comparing FIGS. 4 and 5, the lift-off structure, comprising polyimide 15, silicon dioxide 18, and metal 22 is removed. The particular technique used for removal of the lift-off structure will depend upon the type of polyimide material 15 employed. In the preferred embodiment with the Ciba-Geigy material referred to above, the lift-off structure may be removed by soaking it in methylene chloride and agitating it ultrasonically. The lateral etch back of polyimide 15 has been found to allow more complete removal of the lift-off structure and to allow the metallization to extend about 0.1 microns beyond the diameter of the hole.

The resulting structure is shown in FIG. 5, which illustrates the substantially planar surface 25 comprised of the upper surface of silicon dioxide 12 and metal 22. This substantially planar surface allows the fabrication of subsequent layers of material, for example, to passivate or insulate the structure with higher reliability than did prior art lift-off processes.

Figure 6:
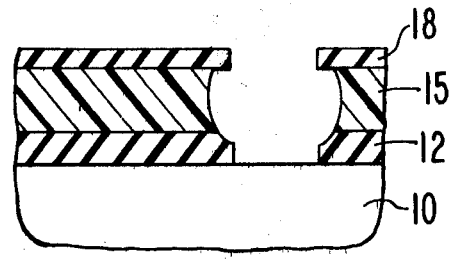
FIG. 6 is a cross-sectional view of an alternate embodiment in which silicon dioxide 12 has been further etched.
Figure 7:
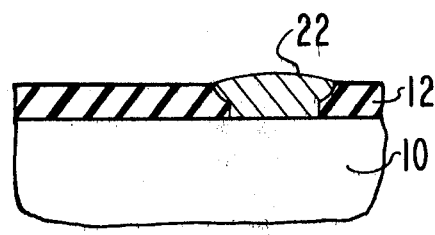
FIG. 7 is a subsequent cross-sectional view after deposition of metal and removal of the masking material.

In another embodiment of the invention the process described above is modified by slightly etching the edges of silicon dioxide 12 in opening 23. This may be achieved by soaking the wafer in a hydrofluoric acid solution after etching the opening and before metallization. The hydrofluoric acid chemically attacks the silicon dioxide and will etch the edge of the opening as shown in FIG. 6. In this manner assurance of more complete metal coverage on the exposed surface of substrate 10 is achieved after metallization and lift-off as shown in FIG. 7. Furthermore, the shallower slope of the corners of opening 23 permits deposition of metal at a lower temperature.

Although preferred embodiments of the invention have been described above, these embodiments are intended to illustrate the invention. The scope of the invention may be ascertained from the appended claims.

I claim:

1. A lift-off process for fabricating self-aligned regions of first and second material on the surface of semiconductor structure comprising;
   depositing a layer of first material on the surface of the semiconductor;
   depositing a layer of a polyamide on the layer of first material;
   depositing at least one layer of masking material on the polyimide;
   defining openings to the surface of the semiconductor structure through the at least one layer of masking material, the layer of polyimide, and the layer of first material, including the step of isotropically etching substantially only the polyimide in the openings;
   depositing second material on the semiconductor structure and on the at least one layer of masking material; and
   removing the polyimide and the second material deposited thereon.

2. A process as in claim 1 wherein the first material comprises electrically insulating material and the second material comprises electrically conductive material.

3. A process as in claim 2 wherein the at least one layer of masking material comprises silicon dioxide.

4. A process as in claim 3 wherein the at least one layer of masking material further comprises photoresist.

5. A process as in claim 2 wherein the electrically conductive material comprises aluminum and the electrically insulating material comprises silicon dioxide.

6. A process as in claim 1 wherein the semiconductor structure comprises silicon and the first material comprises silicon dioxide.

7. A process as in claim 6 further comprising the step of etching the edges of the silicon dioxide in the openings.

8. A process as in claim 7 wherein the step of depositing the second material comprises raising the semiconductor structure to a temperature of approximately 325° C.

* * * * *